April 8, 1958
R. A. GUDMUNDSEN ET AL
FUSED JUNCTION SEMICONDUCTOR DEVICES AND
METHOD OF MAKING SAME
Filed Feb. 2, 1954
2,829,992

INVENTOR.
RICHARD A. GUDMUNDSEN,
WARREN P. WATERS,
BY
Nicholas T Volk
THEIR ATTORNEY.

Patented Apr. 8, 1958

2,829,992

FUSED JUNCTION SEMICONDUCTOR DEVICES AND METHOD OF MAKING SAME

Richard A. Gudmundsen and Warren P. Waters, Inglewood, Calif., assignors to Hughes Aircraft Company, Culver City, Calif., a corporation of Delaware Application February 2, 1954, Serial No. 407,745

5 Claims. (Cl. 148—1.5)

This invention relates to fused junction transistors, and more particularly to fused junction transistors wherein the emitter and collector junctions are formed in a monatomic semiconductor specimen of varied thickness, and to methods of making such transistors.

Relatively recent advances in the semiconductor art have brought forth a new type of semiconductor triode or transistor, designated by the term "junction transistor." The emitter and collector rectifying barriers in this type of transistor are produced by creating alternate regions of opposite conductivity-type semiconductor material in a continuous solid specimen of a monatomic semiconductor.

The term "monatomic semiconductor," as utilized herein, is considered generic to both germanium and silicon. It is employed to distinguish these semiconductors from ionic semiconductors, such as copper oxide. Although the invention will be disclosed with particular reference to germanium, it is to be expressly understood that silicon may also be employed in the fused junction transistors of the present invention.

In the semiconductor art, a region of monatomic semiconductor material containing an excess of donor impurities and yielding an excess of free electrons is considered to be an N-type region, while a P-type region is one containing an excess of acceptor impurties resulting in a deficit of electrons, or stated differently, an excess of holes. When a continuous solid specimen of monatomic semiconductor material has two N-type regions separated by one P-type region, it is termed an "N–P–N" junction transistor, whereas a specimen having two P-type regions separated by one N-type region is termed a "P–N–P" junction transistor.

The term "active impurities" is herein utilized to denote those impurities which affect the electrical rectification characteristics of monatomic semiconductor material, as distinguished from other impurities having no appreciable effect upon these characteristics. Generally speaking, active impurities are added intentionally to substantially intrinsic semiconductor material, although in many instances, certain of these impurities may be found in the semiconductor material in an intermediate stage of refinement. Active impurities are classified either as donors, such as phosphorous, arsenic, and antimony, or as acceptors, such as gallium, indium, and aluminum.

In the semiconductor art, both N–P–N and P–N–P junction transistors are usually produced by either of two well-known processes, namely, the crystal-pulling technique, wherein the junction transistor is grown by withdrawing a seed crystal from an active-impurity-doped melt of monatomic semiconductor material, and the fusion process, wherein two spaced regions of a semiconductor specimen of one conductivity type are converted to the opposite conductivity type.

According to the prior-art crystal-pulling technique, a seed crystal of semiconductor material of one conductivity type is withdrawn from a melt of the base semiconductor material the constituency of which is changed during the crystal-growing process to produce at least the last grown P–N junction in the device. To produce an N–P–N junction transistor, for example, an N-type seed crystal is brought into contact with a melt of P-type germanium, containing an impurity of the acceptor type, and is then withdrawn from the melt at such a rate as to maintain a substantially planar boundary between the growing solid crystal and the liquid melt. When the crystal has grown to include a base region of P-type germanium having a thickness of the order of .001 of an inch, the melt is doped with an active impurity of the donor type in sufficient quantity to convert the melt to N-type germanium. Thereafter, as the crystal continues to grow, a second region of N-type germanium is produced.

This prior-art method of producing junction transistors has several inherent limitations. Firstly, the method is not readily adapted to mass production because of the relatively slow rates at which the crystal must be drawn and the relatively precise process controls required to regulate the thickness of the base region and to prevent the formation of lattice defects in the crystal. Secondly, numerous difficulties are encountered in locating and ohmically connecting a base electrode to the relatively thin base region. Thirdly, the base impedance of this type of transistor is usually relatively high in comparison with the base impedance of junction transistors produced by the fusion process. In addition, only a relatively few transistors can be produced from each crystal, since the transistors may be cut from only that portion of the crystal adjacent the P–N junctions.

According to the prior-art fusion process for producing junction transistors, two spaced regions of a semiconductor specimen of one conductivity type are converted to the opposite conductivity type by fusing two pellets, each including an active impurity either alone or in alloy form, to opposite surfaces of the starting specimen. A preferred method for carrying out the fusion process is disclosed in copending U. S. patent application Serial No. 393,038 for "Fused Junction Semiconductor Devices," by Justice N. Carman et al., filed November 19, 1953. In carrying out this process, the combination of the starting specimen and the two alloy pellets is first heated to a predetermined value of temperature above the melting point of the pellets, but below the melting point of germanium, thereby melting the alloy pellets. The molten pellets, in turn, dissolve the adjacent regions of the germanium specimen and form an alloy with the dissolved germanium, the amount of germanium dissolved, or in other words, the depth of penetration of the molten alloy, being dependent upon the solubility of germanium in the alloy at the applied temperature.

As the combination is thereafter cooled, substantially all of the dissolved germanium, along with many substituted impurity atoms from the alloy pellets, are redeposited upon the starting specimen and produce two spaced regions of impurity-doped germanium, the conductivity type of which is opposite to that of the starting specimen. The unconverted portion of the starting specimen thereafter constitutes the base region of the transistor, while the two newly formed regions of opposite conductivity-type material constitute the emitter and collector regions, respectively, and are separated from the base region by the emitter and collector rectifying barriers, respectively.

The principal disadvantage of the prior-art fusion process has been the difficulty of consistently producing transistors with relatively thin base regions. It is known, for example, that the distance between the emitter and collector junctions should be of the order of .001 of an inch. If the fusion process is utilized with a semiconductor starting specimen having a thickness of the order of .015 of an inch, the formation of accurately spaced emitter and collector barriers must be carried out deep within the specimen. In practice, however, it is very difficult to attain accurate control of base-region thickness when the emitter and collector regions are formed more than .002 of an inch below the surface of the specimen, since crystal imperfections, surface tension, and other allied metallurgical phenomena contribute to make accurate control of such deep penetration impractical. Consequently, the emitter and collector regions frequently either short circuit across the base region, or are spaced apart by too large a distance. In addition, the relatively large alloy pellets and high temperatures required to dissolve a sufficient amount of the germanium specimen have been found to affect adversely the mechanical and electrical properties of the completed device.

Still other attempts have been made to produce fused junction transistors by carrying out the fusion process upon a thin sheet of semiconductor material having a thickness of the order of .004 of an inch. Although the spacing or separation between the emitter and collector junctions created in this manner is relatively controllable, the semiconductor sheet is so thin that the resultant transistor is very delicate, owing to the characteristic brittleness of material such as germanium and silicon. Consequently, it becomes extremely difficult to attach the associated electrodes to the base, emitter, and collector regions without fracturing the semiconductor specimen. In addition, even if electrodes are finally affixed to the device, delicate handling is required thereafter to prevent subsequent fracturing of the semiconductor specimen. Still another significant disadvantage of this prior-art form of fusion transistor is that the base impedance is relatively high owing to the small cross-sectional area of the base region, thereby limiting the gain, frequency response, and power dissipation of the device.

The present invention, on the other hand, overcomes the above and other disadvantages of the prior-art junction transistors by providing a mechanically rugged and readily reproducible fused junction transistor in which the separation of the emitter and collector junctions is accurately controllable, in which the associated electrodes are easily affixed to their respective regions, and in which the base impedance is relatively low. According to the fundamental concept of the invention, fused junction transistors are produced by employing as a starting blank a semiconductor specimen of varied thickness, having a relatively thin central region to enable the creation of accurately spaced emitter and collector regions within the blank, and a relatively thick peripheral region for subsequently connecting to the associated base electrode.

More particularly, the semiconductor starting specimens or blanks employed in the fused junction transistors according to this invention have a relatively thick peripheral region of substantially uniform thickness and have a recess or cavity formed in the central portion of at least one surface to provide a relatively thin central region of semiconductor material in which the emitter and collector junctions are created. Either the emitter or collector junction is then formed by placing an alloy pellet on one surface of the central region and carrying out the fusion operation, while the other junction is formed simultaneously by placing a second alloy pellet on the opposite surface of the central region and fusing the pellet to the specimen.

According to one method of the invention, the recess in the semiconductor specimen may be created by a controlled abrasive operation wherein a limited area of a wafer of semiconductor material is sandblasted with a relatively fine abrasive for a predetermined length of time. According to still other methods of the invention, on the other hand, the recess may be formed by an abrasive process employing a grinding or vapor-blasting technique, for example.

At the conclusion of the abrasive operation, the semiconductor blank is etched for a determinate period to remove surface damage and any oxide film which may have formed thereon, and to further remove semiconductor material from the central region of the blank until the desired central-region thickness has been achieved. By judicious selection of the over-all dimensions of the starting wafers, the peripheral and central-region thickness of the resulting blanks may both be very accurately controlled. Consequently, the transistor blanks of the present invention have a peripheral region which is sufficiently thick to provide an extremely rugged mechanical connection to the associated base electrode and to provide a relatively low-impedance base region in the completed fused junction transistor. The relatively thin central region of the transistor blanks, on the other hand, permits the formation of emitter and collector regions which may be consistently and accurately spaced by distances as small as one-half a mil. Accordingly, the methods of the invention are ideally suited to the mass production of high-gain, high-frequency fused junction transistors having relatively high power ratings.

It is, therefore, an object of this invention to provide transistor blanks having a recess in the central region thereof to permit the formation of accurately spaced emitter and collector regions in the blank.

Another object of this invention is to provide a transistor blank of varied thickness for producing mechanically rugged fused junction transistors in which the spacing between the emitter and collector regions is accurately controllable to distances of the order of .0005 of an inch.

It is also an object of this invention to provide fused junction transistors in which the starting specimen has a recess formed in one surface thereof to provide a relatively thin region of semiconductor material wherein accurately spaced emitter and collector regions are formed.

Still another object of this invention is to provide fused junction transistors in which the emitter region is formed adjacent the bottom of a recess in one surface of the semiconductor starting specimen, and in which the collector region is formed opposite the emitter region and adjacent the opposing surface of the semiconductor starting specimen.

It is a further object of this invention to provide methods for producing transistor blanks by abrading the central region of a semi-conductor wafer to form a recess of predetermined depth therein, and thereafter etching the wafer.

An additional object of this invention is to provide methods for producing fused junction transistors by eroding semiconductor material from the central region of one surface of a semiconductor wafer to create a relatively thin region of semiconductor material, and forming the emitter and collector junctions adjacent each other within said thin region.

The novel features which are believed to be characteristic of the invention, both as to its organization and method of operation, together with further objects and advantages thereof, will be better understood from the following description considered in connection with the accompanying drawings in which several embodiments of the invention are illustrated by way of examples. It is to be expressly understood, however, that the drawings are for the purpose of illustration and description only, and are not intended as a definition of the limits of the invention.

Figures 1, 2, 3:
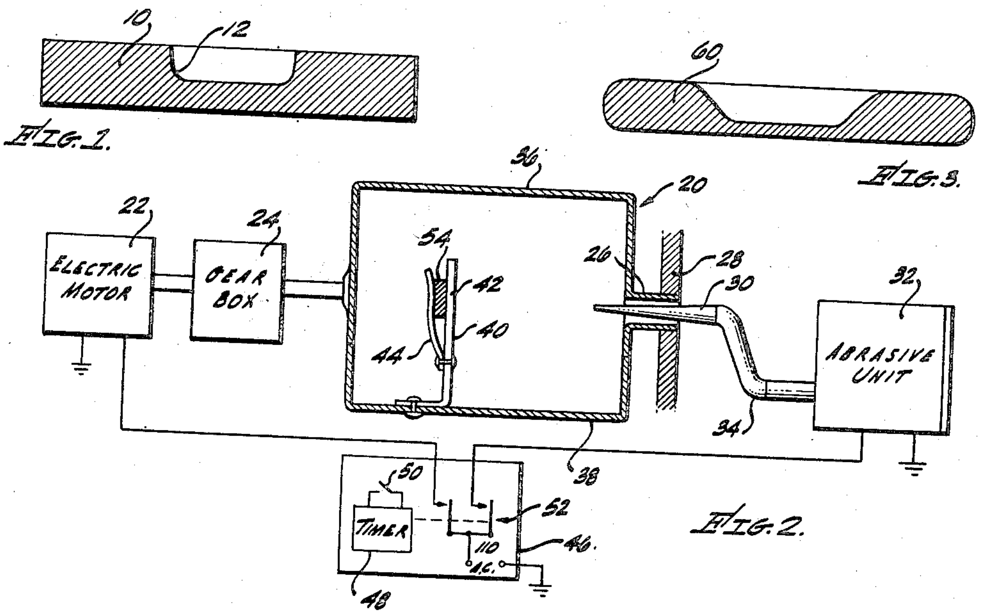
Fig. 1 is a sectional view of a transistor blank, according to the invention, in an intermediate stage of production.
Fig. 2 is a schematic view, partly in section, of one form of apparatus for producing the transistor blank shown in Fig. 1.
Fig. 3 is a sectional view of the transistor blank shown in Fig. 1 after it has been etched prior to being utilized in the fused junction transistor of the invention.

Referring now to the drawings, wherein like reference characters are utilized to designate like or corresponding parts throughout the several views, there is shown a semiconductor transistor blank 10 of germanium in an intermediate stage of production prior to being utilized as the starting specimen in a fused junction transistor according to the invention. Blank 10 is preferably a germanium single crystal which has been crystallographically oriented so that its upper and lower surfaces, as viewed in Fig. 1, are the 111 surface planes in the crystal. Crystallographic orientation of the specimen is considered desirable to promote the growth of planar P–N junctions within the specimen during the fusion operation which will be described below. The 111 surface plane appears to be preferable for carrying out the method of this invention, the theory being that the relatively high atomic density of the crystal on this particular plane permits better control of subsequent operations. It should be pointed out, however, that other relatively dense crystallographic surface planes, such as the 110, 100, and 112 may be employed.

According to the invention, blank 10 has a recess or cavity 12 formed in the central portion of its upper surface, as viewed in Fig. 1, the surface of blank 10 at the bottom of recess 12 being preferably planar. The width of the recess should be sufficient to permit an alloy pellet of predetermined size to be placed therein to enable subsequent formation of the emitter junction in that portion of blank 10 immediately adjacent the bottom of the recess. The depth of the recess, on the other hand, is determined in view of several factors, namely, the over-all thickness of the germanium wafer in which the recess is formed, the amount of germanium which will be removed during subsequent etching operations, and the desired thickness of the central region of the transistor blank when the emitter and collector regions are to be formed therein. Typical over-all dimensions of blank 10 are ⅛" x ⅛" x .020 of an inch. If it is assumed that the emitter junction is to be subsequently formed with a 3-milligram alloy pellet after blank 10 has been etched to a central thickness of the order of .003 of an inch by removal of a layer of .004 of an inch thick from each of the exposed surfaces of the blank, the width of recess 12 may be of the order of .065 of an inch, while its depth is of the order of .009 of an inch.

Referring now to Fig. 2, there is shown one form of apparatus which may be utilized for producing recess 12 in transistor blank 10. The apparatus includes a sandblasting chamber, generally designated 20, which is mechanically coupled to an electric motor 22 through a reduction gear box 24 and is rotatable at speeds of the order of 2 revolutions per second when motor 22 is energized. The sandblasting chamber includes a flanged portion 26 which is journaled in a suitable bushing 28 and is adapted to enclose a sandblasting nozzle 30 which extends within chamber 20 and is clamped in position by a suitable external jig, not shown. Nozzle 30 is preferably constructed of a relatively hard material, such as tungsten carbide, and is coupled to an abrasive unit 32 by a conduit 34 for introducing a stream of abrasive material into sandblasting chamber 20 when abrasive unit 32 is energized.

The sandblasting chamber, as illustrated in Fig. 2, consists of a drum portion 36 and an intermediate removable portion 38 which is rigidly attachable to drum portion 36 by means of a suitable clasp, not shown. Affixed to removable portion 38 is a verical masking member 40 having an aperture 42 in the center thereof, aperture 42 having a diameter equal to the preselected width of the recess in the transistor blanks being produced and being in substantial alignment with nozzle 30 when the two intermating portions of the sandblasting chamber are clasped together. A clamping member 44 is mounted on masking member 40 for positioning and holding the specimen to be operated upon behind the masking member.

The apparatus also includes a source 46 of electrical energy comprising an electrical timer 48 which is energizable upon closure of an actuating switch 50 to close a pair of associated switch contacts, generally designated 52. Closure of contacts 52, in turn, connects one terminal of a 110-volt alternating-current source, not shown, to one input terminal of each of electric motor 22 and abrasive unit 32, a second input terminal on each of these elements being grounded. Timer 48 may be any conventional electronic or electromechanical timing system which is actuable for closing an associated electrical circuit for a predetermined time interval. Since numerous timers of this type are well known in the art, further description of timer 48 is considered unnecessary.

Abrasive unit 32 may be any commercially available apparatus suitable for performing relatively fine abrasive operations upon being energized through an associated electrical circuit. One such apparatus, for example, is the "S. S. White Industrial Airbrasive Unit, Model C" manufactured by the S. S. White Dental Manufacturing Company of New York, New York. One suitable abrasive compound which may be utilized therewith for producing a transistor blank according to the invention is "S. S. White Airbrasive Powder #1," consisting of finely powdered aluminum oxide, the particles of which average 27 microns in size. It should be noted here that when carrying out the method of this invention with the apparatus shown in Fig. 2, the abrasive compound should not be reused.

In operation, a germanium single-crystal wafer 54 which has been cut and lapped to a standard size is first positioned behind masking member 40 and clamped with clamping member 44 so that aperture 42 is over the center of the wafer. The over-all dimensions of wafer 54 are preferably similar to the over-all dimensions set forth herein above for the partially completed transistor blank shown in Fig. 1.

After wafer 54 has been properly centered adjacent masking member 40, the two intermating portions of sandblasting chamber 20 are clasped together, thereby enclosing the wafer within the sandblasting chamber and positioning the unmasked portion of the wafer in front of nozzle 30. The distance between nozzle 30 and wafer 54 is not especially critical and may be of the order of one and one-half inches, for example. When wafer 54 has been enclosed in chamber 20, switch 50 is closed, thereby actuating timer 48 to close its associated contacts. Consequently, motor 22 is energized to rotate drum 20, while abrasive unit 32 is energized to emit a flow of abrasive compound which is directed toward masking member 20 by nozzle 30 and impinges upon the unmasked central portion of wafer 54.

The time duration through which the sandblasting operation is carried out is dependent upon the desired depth of the recess in the wafer and the rate of erosion of the germanium. The rate of erosion, in turn, is dependent upon the distance from the nozzle to the wafer, the type and size of the abrasive compound employed, the velocity of the abrasive stream, and the density of the abrasive compound in that portion of the abrasive stream striking the wafer. As pointed out hereinbefore, the distance between the nozzle and the germanium wafer may be of the order of one and one-half inches and is not especially critical. In addition, the velocity of the abrasive stream is substantially constant for any given abrasive unit and is approximately one thousand feet per second for the particular industrial abrasive unit described herein above. Assuming, therefore, that the nozzle distance and the velocity of the abrasive stream are constant, and that the abrasive compound employed consists of relatively fine particles of aluminum oxide, as previously described, the rate of erosion of the germanium is a function only of the amount of abrasive compound included in the abrasive stream.

The abrasive stream is usually formed by passing a stream of gas under pressure beneath an associated hopper filled with abrasive compound, some of which is drawn into the gas stream by differential pressure, for example. Accordingly, the density of the abrasive compound in the abrasive stream may theoretically be regulated by merely controlling the rate of flow of the compound from the hopper into the gas stream. In practice, however, it has been found that the density of the abrasive compound varies over a period of time, owing to the tendency of the orifices in the abrasive unit to clog. Accordingly, when producing transistor blanks according to the invention, it has been found preferable first to place a test wafer of germanium in sandblasting chamber 20 and to carry out a sequence of timed and relatively short abrasive operations upon the wafer. The depth of the recess in the wafer is measured after each operation, as with a micrometer, for example, and the sequence of abrasive operations continued until the recess in the wafer is of the desired depth. In practice, three successive abrasive operations are usually sufficient to achieve the desired depth of penetration.

The time required for the successive abrasive operations on the test wafer is then totalled and timer 48 is set to operate abrasive unit 32 for this period of time whenever switch 50 is actuated. Thereafter, the abrasive operation may be carried out as a single operation upon numerous individual germanium wafers of similar thickness with practically no variation in the depth of the recesses produced. Consequently, the thickness of the central region of each of the resultant germanium transistor blanks is substantially identical.

It may be recalled that the bottom of the recess formed by the abrasive process is preferably planar and parallel to the opposite surface of the wafer or blank. Owing to the fact that sandblasting chamber 20 is rotated during the abrasive operation, the shape of the germanium blank at the bottom of the recess is always symmetrical about an axis through the center of the recess. Consequently, the formation of a planar surface at the bottom of the recess automatically insures that the bottom of the recess will also be substantially parallel to the opposite surface of the wafer.

The shape of the germanium wafer at the bottom of the recess is controllable by regulation of the tip diameter of nozzle 30 and of the direction in which the abrasive stream strikes the wafer. For example, it has been found that if a nozzle having a tip diameter of the order of .018 of an inch is directed at the center of aperture 42 in masking member 40, the surface of the bottom of the recess in the transistor blank is concave, whereas the surface in convex if the nozzle is positioned so that the abrasive stream impinges on the blank immediately adjacent the periphery of the aperture in masking member 40. On the other hand, a substantially planar surface is produced by positioning the nozzle so that the abrasive stream is directed at a region intermediate the center of aperture 42 and the periphery of the aperture.

After the germanium starting wafer has been transformed by the abrasive operation to a transistor blank having a configuration such as that illustrated in Fig. 1, the blank is immersed in an etching solution to remove any surface damage caused by the abrasive operation and any oxide coating which may have formed on the surface. In addition, the etching operation is employed to regulate the thickness of the central region of the completed transistor blank.

The etching step is preferably carried out by immersing the transistor blanks for a determinate period of any of several suitable etchants known to the semiconductor art. One of these etchants, for example, is a solution containing three parts 48% hydrofluoric acid, 5 parts concentrated nitric acid, 5 parts of glacial acetic acid, and 10 drops of liquid bromine for each 50 cc.'s of solution. After the tranistor blanks have been etched to the desired thickness they are thoroughly rinsed in a suitable solvent such as absloute methyl alcohl, for example, to remove any etchant which may adhere to the surface of the blanks at the completion of the etching step. It should be pointed out that while rinsing the blanks and while carrying out subsequent steps according to the methods of this invention, care should be taken to avoid exposing the etched blanks to water or an excessively humid atmosphere in order to prevent the formation of new oxide layers on the blanks.

Referring now to Fig. 3, there is shown a completed transistor blank 60 according to the invention, which has been produced by carrying out the above-described etching step on the partially completed transistor blank shown in Fig. 1. It will be recognized that the thickness of the central region of blank 60 is equal to the thickness of the partially completed blank shown in Fig. 1 minus the thickness of the germanium layer etched off opposite surfaces of the blank during the etching operation. Accordingly, if it is assumed that the central region of the partially completed blank was .011 of an inch thick, a central region thickness of .003 of an inch may be achieved in blank 60 by removing .004 of an inch from each surface of the blank during the etching operation.

At the completion of the etching and rinsing steps, emitter and collector regions may be formed in blank 60 by carrying out the methods disclosed in the aforementioned copending application of Carman et al., Serial No. 393,038. According to this technique, two alloy pellets, each including an active impurity and a solvent metal from the group consisting of mercury, thallium, lead, and bismuth, are placed in contact with opposing surfaces of a germanium specimen which includes an active impurity of the opposite type, and are fused thereto to combine two spaced regions of the specimen to the opposite conductivity type, thereby forming the emitter and collector junctions. In applying this technique to the transistors of the present invention, one of the alloy pellets is placed in the bottom of the recess in transistor blank 60, while the other pellet is placed adjacent the opposite surface of the blank.

Assume now that the transistor blank is P-type germanium, for example, and that the active impurity in the alloy pellets is a donor impurity, such as arsenic, for creating N-type emitter and collector regions. The combination of the transistor blank and the two contacting alloy pellets is then heated to a predetermined value of temperature above the melting point of the pellets, but below the melting point of the germanium, to dissolve a predetermined amount of germanium adjacent each of the pellets. As the combination is cooled thereafter, substantially all of the dissolved germanium, together with substituted donor atoms from the alloy pellets, is precipitated back onto the starting blank two crystallographically regrown N-type regions constituting the emitter and collector regions, respectively. After substantially all of the dissolved germanium has been regrown onto the transistor blank, the solvent metal from the original alloy pellets, together with the remainder of the dissolved germanium and donor impurity, crystallizes as two alloy buttons which are ohmically affixed to the emitter and collector regions, respectively, and which protrude above the surface of the germanium specimen or blank.

Figure 4:
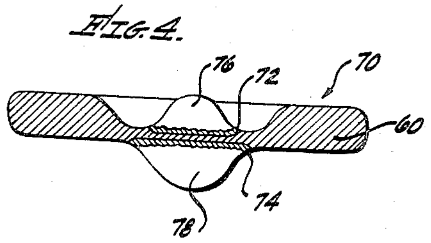
Fig. 4 is a sectional view of a fused junction transistor, according to the invention, which has been produced by fusing two alloy pellets to opposite surfaces of the central region of the transistor blank shown in Fig. 3.

Referring now to Fig. 4, there is shown a fused junction transistor, generally designated 70, which has been produced by fusing two alloy pellets to the transistor blank shown in Fig. 3 in accordance with the above-described fusion technique. The portion of transistor blank 60 which has retained the conductivity type of the germanium starting blank, constitutes the base region, while two regrown regions 72 and 74 of opposite conductivity-type germanium constitute the regrown emitter and collector regions, respectively, produced by the fusion process. Thus, if it is assumed that the starting blank was P-type germanium, regions 72, 60, and 74 constitute an N–P–N junction. Ohmically attached to the emitter and collector N-type regions are two alloy buttons 76 and 78, respectively, formed from the original alloy pellets and germanium at the completion of the cooling step, as outlined herein above. Accordingly, assuming that lead-arsenic alloy pellets were employed to create N-type regions 72 and 74, the constituents of buttons 76 and 78 are lead, arsenic, and germanium, the germanium in the buttons being that portion of the dissolved germanium which did not redeposit upon the germanium blank during the cooling step.

Figure 5:
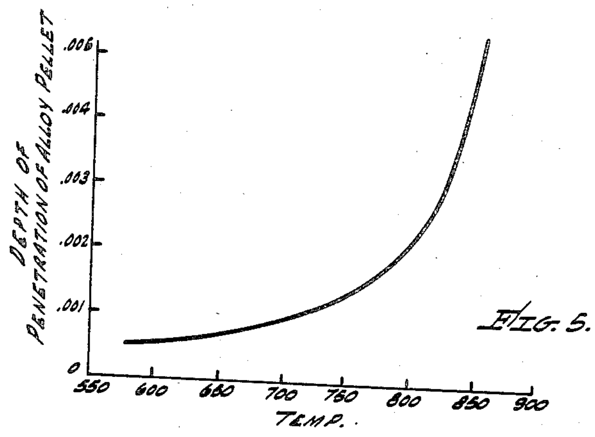
Fig. 5 is a curve illustrating the relationship between temperature and depth of penetration of an alloy pellet when the fusion operation is carried out.

It will be recognized that the spacing between emitter region 72 and collector region 74, or in other words, the thickness of the base region, is a function of two parameters, namely, the central-region thickness of the starting blank, and the depth of penetration of the alloy pellets into the starting blank during the fusion operation. It has been found, as disclosed in the above-mentioned copending application of Carman et al., that for relatively small distances the penetration of an alloy pellet of predetermined size and constituency may be very accurately controlled by merely carrying out the fusion operation at a predetermined temperature. With reference to Fig. 5, for example, there is shown a curve illustrating the relationship between fusion temperature and depth of penetration for a 3-milligram alloy pellet including 97% lead and 3% arsenic.

It is clear, therefore, that if the central-region thickness of the starting blank is sufficiently small and is relatively precise, the spacing between emitter region 72 and collector region 74 may be very accurately controlled. In practice, the selected thickness of the central region of the transistor starting blank may be as high as .004 of an inch or as low as .001 of an inch, depending upon the values selected for the other parameters and upon the base-region thickness desired in the completed transistor.

The most significant advantage of the fused junction transistor of the invention over the junction transistors of the prior art is that the base region may be made as thin as .0005 of an inch, owing to the thin central region in the transistor starting blank, while still providing a device having a relatively low base resistance and a mechanically rugged exterior region for connecting the device to its associated base electrode. Accordingly, the fused junction transistors of the invention are ideally suited for high-frequency applications, wherein transistors having both low base resistance and very thin base regions are desirable. In addition, it will be recognized that the relatively thick exterior portion of the base region also provides means for rapidly conducting away heat generated at the emitter and collector junctions, thereby further increasing the power rating of the device and increasing its maximum ambient operating temperature.

Figure 6:
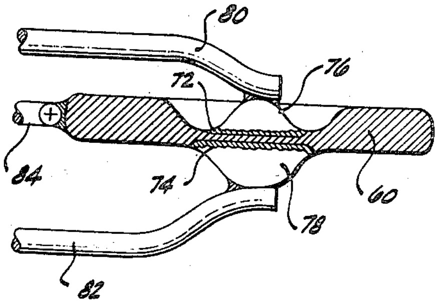
Fig. 6 is a sectional view of the fused junction transistor shown in Fig. 4, illustrating one manner in which emitter, collector, and base electrodes may be affixed to the device.

After the fused junction transistor shown in Fig. 4 has been produced, the device is preferably etched in any one of several manners known to the art to remove any undesirable impurities from the surface of the device and to improve its electrical characteristics. Thereafter, as shown in Fig. 6, an emitter electrode 80, a collector electrode 82, and a base electrode 84 are ohmically affixed, as with solder for example, to alloy buttons 76 and 78 and to base region 60, respectively. It should be pointed out that if solder is utilized for affixing base electrode 84 to the base region, the solder preferably should be doped with an active impurity of the type which determines the conductivity type of the base region in order to insure a non-rectifying base connection.

It will be recognized, of course, that other operational steps may be carried out on the fused junction transistor of the invention before it is encapsulated. For example, it may be desirable to lower the base resistance of the transistor still further by evaporating a metallic layer on one surface of base region 60, in accordance with the methods disclosed in copending U. S. patent application, Serial No. 387,274, for "Junction-Type Semiconductor Devices" by Harvey Stump, filed October 20, 1953, now U. S. Patent No. 2,802,159.

Figure 7:
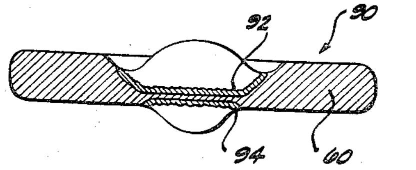
Fig. 7 is a sectional view of a modified form of a fused junction transistor, according to the invention.

It will also be recognized that the collector junction may be formed adjacent the recess in the bottom of the transistor blank while the emitter junction is formed adjacent the opposite surface of the blank. With reference to Fig. 7, for example, there is shown a fused junction transistor, generally designated 90, which has been produced by creating a collector region 92 adjacent the bottom of the recess in transistor blank 60, and an emitter region 94 adjacent the opposite surface of the blank. Several inherent advantages of the fused junction transistor shown in Fig. 7 are that the collector region is readily centered in the device, the base impedance to the collector junction is lowered still further, and the mechanical strength of the central region of the transistor is increased.

It should be understood, of course, that the foregoing disclosure relates only to a preferred embodiment of the invention and that numerous modifications or alterations may be made therein without departing from the spirit and scope of the invention. For example, the recess in the transistor blank of the invention may be produced by other controlled abrasive processes, such as by grinding, or by vapor-blasting the germanium starting wafer with a slurry composed of water and a suitable abrasive such as aluminum oxide, silicon carbide, or decomposed earth.

What is claimed as new is:

1. In a fused junction transistor, a single crystal of active impurity-doped semiconductor material selected from the group consisting of germanium and silicon, said crystal having first and second opposed surfaces and a substantially flat-bottomed recess of predetermined width and depth in said first surface, said second surface being substantially plane said crystal having two spaced regions of one conductivity type adjacent said second surface and the bottom of said recess in said one surface, respectively, the remainder of said crystal being of the opposite conductivity type.

2. A fused junction transistor comprising: a crystallographically oriented active impurity-doped semiconductor specimen selected from the group consisting of germanium and silicon having first and second opposed surfaces, said crystal having a substantially flat-bottomed recess of predetermined depth in said first surface and a first region of N-type conductivity material adjacent the bottom of said recess, said specimen having a second region of N-type conductivity material adjacent said second surface, said second region being spaced from said first region by a region of P-type conductivity material; and first and second alloy buttons electrically connected to and protruding from said first and second regions, respectively.

3. A fused junction transistor comprising: a crystallographically oriented active impurity-doped semiconductor specimen selected from the group consisting of germanium and silicon having first and second opposed surfaces, said crystal having a substantially flat-bottomed recess of predetermined width and depth in said first surface and a first region of P-type conductivity material adjacent the bottom of said recess, said specimen having a second region of P-type conductivity material adjacent said second surface, said second region being spaced from said first region by a region of N-type conductivity material; and first and second alloy buttons electrically connected to and protruding from said first and second regions, respectively.

4. The method of producing a fused junction transistor by converting to one conductivity type two spaced regions of an active impurity-doped semiconductor starting specimen selected from the group consisting of germanium and silicon of the opposite conductivity type, said method comprising the steps of: directing a stream of abrasive to impinge upon at least a portion of one surface of said specimen, effecting relative displacement between said stream of abrasive and said specimen to thereby abrade at least said portion of said surface and form a substantially flat-bottomed recess of a predetermined depth in said specimen, placing two alloy pellets each including an active impurity of said one conductivity type in contact with opposite surfaces of the specimen, one of said pellets being placed in the recess in said specimen, heating the combination of the specimen and the pellets to a temperature above the melting point of the pellets, but below the melting point of said semiconductor specimen, to melt the pellets and dissolve a predetermined amount of the adjacent portions of said specimen, and cooling the combination at a controlled rate to regrow a portion of the dissolved semiconductor material together with atoms of said impurity of said one conductivity type as two spaced regions on opposite sides of said specimen.

5. The method of producing an N–P–N fused junction transistor by converting two spaced regions of a P-type conductivity germanium starting specimen to donor impurity-doped N-type regions, said method comprising the steps of: positioning a crystallographic oriented germanium semiconductor specimen, directing a stream of abrasive to impinge upon at least a portion of one surface of said specimen, effecting relative displacement between said stream of abrasive and said specimen to thereby abrade at least said portion of said surface and form a substantially flat-bottomed recess of a predetermined depth in said specimen, placing two alloy pellets each including an N-type active impurity in contact with opposite surfaces of the specimen, one of said pellets being placed in the recess in said specimen, heating the combination of the specimen and the pellets to a temperature above the melting point of the pellets, but below the melting point of said semiconductor specimen, to melt the pellets and dissolve a predetermined amount of the adjacent portions of said specimen, and cooling the combination at a controlled rate to regrow a portion of the dissolved semiconductor material together with atoms of said N-type impurity as two spaced regions on opposite sides of said specimen.

References Cited in the file of this patent

UNITED STATES PATENTS

| | | |
|---|---|---|
| 2,441,590 | Ohl | May 18, 1948 |
| 2,502,479 | Pearson | Apr. 5, 1950 |
| 2,560,594 | Pearson | July 17, 1951 |
| 2,563,503 | Wallace | Aug. 7, 1951 |
| 2,597,028 | Pfann | May 20, 1952 |
| 2,629,800 | Pearson | Feb. 24, 1953 |
| 2,644,852 | Dunlap | July 7, 1953 |
| 2,666,814 | Shockley | Jan. 19, 1954 |
| 2,680,159 | Grover | June 1, 1954 |
| 2,691,736 | Haynes | Oct. 12, 1954 |
| 2,764,642 | Shockley | Sept. 25, 1956 |

FOREIGN PATENTS

| | | |
|---|---|---|
| 1,038,658 | France | May 13, 1953 |

OTHER REFERENCES

RCA Review, December 1953, vol. XIV, No. 4, page 593.

Proceedings of Institute of Radio Engs., vol. 40, November 1952, pages 1341 and 1342.